United States Patent
Imanishi et al.

(10) Patent No.: US 8,110,904 B2
(45) Date of Patent: Feb. 7, 2012

(54) LEAD FRAME FOR SEMICONDUCTOR DEVICE AND METHOD OF MANUFACTURING OF THE SAME

(75) Inventors: Yasuko Imanishi, Kyoto (JP); Takahiro Fukunaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/023,906

(22) Filed: Feb. 9, 2011

(65) Prior Publication Data

US 2011/0221052 A1 Sep. 15, 2011

(30) Foreign Application Priority Data

Mar. 9, 2010 (JP) .................... 2010-051465

(51) Int. Cl.
*H01L 23/495* (2006.01)
(52) U.S. Cl. ........................ 257/666; 257/677
(58) Field of Classification Search ........... 257/666, 257/677
See application file for complete search history.

(56) References Cited

U.S. PATENT DOCUMENTS

| | | | | |
|---|---|---|---|---|
| 5,010,388 A | * | 4/1991 | Sasame et al. | 257/669 |
| 5,483,098 A | * | 1/1996 | Joiner, Jr. | 257/676 |
| 7,488,408 B2 | * | 2/2009 | Tanaka et al. | 205/223 |
| 2006/0125073 A1 | | 6/2006 | Seki et al. | |
| 2009/0108423 A1 | * | 4/2009 | Riedl et al. | 257/675 |
| 2009/0146280 A1 | * | 6/2009 | Shimazaki et al. | 257/676 |

FOREIGN PATENT DOCUMENTS

| | | |
|---|---|---|
| JP | 3998703 | 8/2007 |
| WO | 2007/119522 | 10/2007 |

* cited by examiner

*Primary Examiner* — Douglas Menz

(57) ABSTRACT

Provided are a semiconductor device lead frame and a method of manufacturing of the same that improve adhesive properties between plating layers when a plurality of plating layers are laminated, that control deterioration in wire bonding properties during the manufacturing process of a semiconductor device and worsening of solderability during packaging, and that effectively reduce manufacturing cost. Specifically, the lead frame (2*a*, 2*b*) has a laminated structure that includes a lower plating layer (22) formed on a conductive base material (21) and an uppermost plating layer (23), with an organic film (22) that has metal-binding properties formed between the lower plating layer (21) and the uppermost plating layer (23). The organic film (22) is formed as a monomolecular film in which functional organic molecules (11) self assemble. Each of the organic molecules (11) has functional groups (A1, A1) with metal-binding properties on both ends of a main chain (B1).

10 Claims, 7 Drawing Sheets

FIG. 7A  Oxygen penetrates through surface
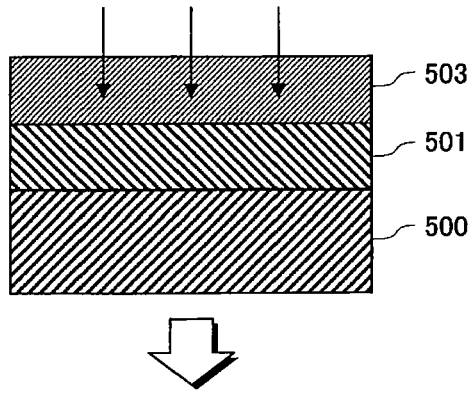
Oxide film forms at boundary surface, layers peel apart
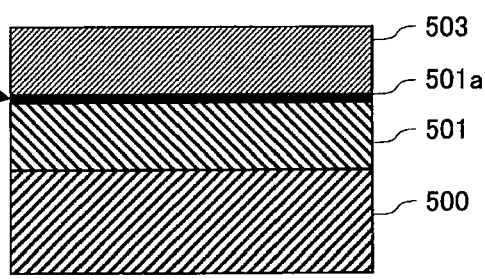
FIG. 7B  Increased adhesion through mutual diffusion
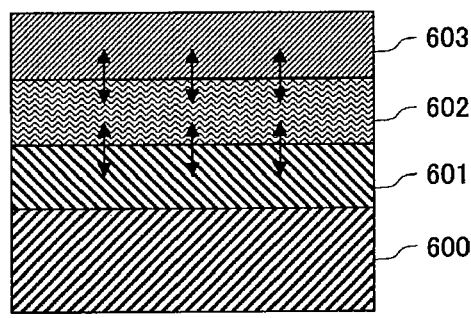
Diffusing component reaches surface, oxide film forms → Increased contact resistance
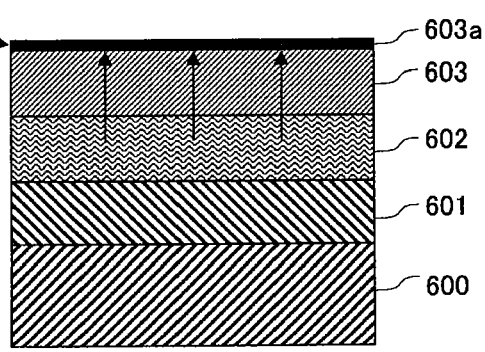

LEAD FRAME FOR SEMICONDUCTOR DEVICE AND METHOD OF MANUFACTURING OF THE SAME

TECHNICAL FIELD

The present invention relates to lead frames for semiconductor devices, the lead frames having a plurality of plating layers laminated thereon, and in particular to technology for improving adhesive properties between plating layers.

BACKGROUND ART

A lead frame formed by a metal body is used as a component for electrical connection in semiconductor elements such as LEDs, LSIs, etc. The semiconductor element is electrically connected to the lead frame by wire bonding. Along with the lead frame, the semiconductor element is sealed with resin during production and is then connected to a substrate or the like in a semiconductor device using, for example, solder.

Excellent wire bonding properties and solderability are required in the manufacturing process of the semiconductor device. To guarantee these properties, a plating layer of a precious metal is sometimes provided in the electrical connection component such as the lead frame. Caution is required, however, as the plating layer may peel off or may become lacking. In other words, if a plating layer that has been provided peels off at a later point, a conductive base or lower plating layer will undergo chemical changes such as corrosion or oxidation, thus worsening the wire bonding properties and the solderability. Therefore, it is important for the provided plating layer to have excellent adhesive properties so that the plating layer does not peel off.

One known technology for addressing this problem is as follows. As shown in the cross-section diagram in FIG. 6A, a lead frame is formed from a conductive base 300, a nickel lower plating layer 301 thereon, and a silver uppermost plating layer 303. Between the lower plating layer 301 and the uppermost plating layer 303, a copper intermediate plating layer 302 is provided, thus guaranteeing adhesive properties between the lower plating layer 301 and the uppermost plating layer 303. An improvement in adhesive properties is sought by interdiffusion of copper, which forms a solid solution with both the nickel and the silver.

Another known technology is shown in the cross-section diagram in FIG. 6B. As a lead frame for a semiconductor device, a nickel lower plating layer 401, palladium or palladium alloy intermediate plating layer 402, and a gold uppermost plating layer 403 are formed in this order on a conductive base 400. In this structure as well, excellent adhesive properties between plating layers are guaranteed by using an intermediate plating layer 402 between the lower plating layer 401 and the uppermost plating layer 403, thus attempting to achieve excellent wire bonding properties and solderability.

[Citation List]
[Patent Literature]
[Patent Literature 1] WO 2007/119522
[Patent Literature 2] Japanese Patent No. 3998703
[Summary Of Invention]
[Technical Problem]

When a silver uppermost plating layer is formed on the lead frame, the following problems occur.

As shown in FIG. 7A, in which a lower plating layer 501 and uppermost plating layer 503 are formed in this order on a conductive base 500, oxygen in the atmosphere penetrates into the silver in the uppermost plating layer 503. As a result, the plating in the lower plating layer 501 oxidizes, and an oxide film 501a forms near the boundary surface with the uppermost plating layer 503. Due to the oxide film 501a, the adhesive properties between the uppermost plating layer 503 and the lower plating layer 501 at the boundary surface of these layers become weaker, and these layers may peel apart.

In the structure shown in FIG. 6A, on the other hand, copper in the intermediate plating layer 602 gradually diffuses in the direction of thickness of the layers, as shown in FIG. 7B. If this copper diffuses to the top surface of the uppermost plating layer 603, the copper reacts with oxygen in the atmosphere and oxidizes, forming an oxide film 603a. The oxide film 603a not only reduces wire bonding properties and solderability, but also increases contact resistance.

Although, in order to solve these problems, the intermediate plating layer 602 may be made thinner to control the diffusion of copper, the thickness of the intermediate plating layer 602 then becomes insufficient, and holes form in the intermediate plating layer 602. These holes lead to the problems of corrosion and oxidation of the conductive base 600 and the lower plating layer 601.

As shown in FIG. 6B, gold may also be used as the uppermost plating layer 403. Gold is an extremely stable precious metal with excellent anti-corrosion properties. Using gold as the uppermost plating layer achieves excellent wire bonding properties and solderability. Since gold is an expensive precious metal, however, thick gold plating results in an extremely high cost. Conversely, whereas a thin plating reduces cost, holes may form in the gold plating constituting the uppermost plating layer 403. Oxygen, water, etc. in the atmosphere may penetrate through the holes, leading to corrosion and oxidation of the conductive base 400 and the lower plating layer 401.

Furthermore, a problem with the manufacturing process of such a lead frame is that the lower plating layer, intermediate plating layer, and uppermost plating layer each have to be formed as separate plating layers, which reduces efficiency of manufacturing. An enormous manufacturing cost is thus necessary for facilities and equipment to perform such predetermined plating processes.

The present invention has been conceived in light of the above problems, and it is an object thereof to provide a lead frame for a semiconductor device and a method of manufacturing of the same that improve adhesive properties between plating layers when a plurality of plating layers are laminated, that control, during the manufacturing process of a semiconductor device, deterioration in wire bonding properties and worsening of solderability when packaged, and that effectively reduce manufacturing cost.

[Solution to Problem]

In order to solve the above problems, a lead frame for a semiconductor device according to the present invention comprises: an electrically conductive base; a lower plating layer formed on the electrically conductive base; an organic film formed on the lower plating layer; and an uppermost plating layer formed on the organic film, wherein the organic film has metal-binding properties with respect to the lower plating layer and the uppermost plating layer.

The lower plating layer, or both the lower plating layer and the uppermost plating layer, may be formed of a precious metal.

The organic film may include a plurality of organic molecules each having a molecular configuration with two or more polar groups, and one of the polar groups in each organic molecule may be bound to metal forming the lower plating layer, so that the organic film coats the lower plating layer.

The organic film may be formed of organic molecules that self assemble, and the organic molecules may have, at both ends, a functional group with metal-binding properties.

A main chain of each of the organic molecules may be a compound, chemical structure, or derivative including at least one selected from the group consisting of an aryl skeleton, an acene skeleton, a pyrene skeleton, a phenanthrene skeleton, a fluorene skeleton, and a nitrogen-containing heterocycle containing at least two nitrogen atoms.

The nitrogen-containing heterocycle may be a compound, chemical structure, or derivative including at least one selected from the group consisting of imidazole, triazole, tetrazole, oxadiazole, thiadiazole, pyrimidine, pyridazine, pyrazine, and triazine.

The functional group with metal-binding properties may be a compound, chemical structure, or derivative including at least one selected from the group consisting of a thiol compound, a sulfide compound, and a nitrogen-containing heterocycle compound.

A method of manufacturing a lead frame for a semiconductor device according to the present invention comprises the steps of (a) forming a lower plating layer on a conductive base; (b) forming an organic film on a surface of the lower plating layer; and (c) forming an uppermost plating layer on a surface of the organic film, wherein the organic film formed in step (c) has metal-binding properties with respect to the lower plating layer and the uppermost plating layer (FIG. 3).

Step (b) may include creating a dispersion liquid by dispersing an organic compound in a solvent and dipping the conductive base on which the lower plating layer is formed into the dispersion liquid (FIG. 4).

[Advantageous Effects of Invention]

In the lead frame for a semiconductor device according to the present invention, a predetermined organic film having metal-binding properties is formed between (i) a lower plating layer formed on a conductive base and (ii) an uppermost plating layer. As a result, the lower plating layer and the uppermost plating layer form a metal bond through the organic film, thus guaranteeing strong adhesive properties in the lower plating layer and the uppermost plating layer. Excellent adhesive properties between plating layers are thus achieved without forming an intermediate plating layer as in a conventional structure, thereby simplifying the structure.

Furthermore, since the lower plating layer is coated by the organic film, the organic film prevents diffusion of metal from the lower plating layer. The organic film also resolves the problems of oxygen in the atmosphere penetrating to the lower plating layer, leading to deterioration in wire bonding properties and solderability, and to an increase in contact resistance.

By appropriately setting the degree of density of the organic film and the structure of the organic molecules, the organic film not only blocks oxygen in the atmosphere, but is also highly effective at blocking corrosive gasses, humidity, moisture, etc. Therefore, providing an organic film with predetermined properties controls corrosion and oxidation of the conductive base and the lower plating layer and prevents formation of an oxide film on the plating boundary surface. This improves adhesive properties between plating layers and prevents the layers from peeling apart. Therefore, even if holes form in the uppermost plating layer, problems such as corrosion or oxidation of the conductive base and the lower plating layer are prevented by providing an organic film.

By using such an organic film that prevents corrosion and oxidation of the lower plating layer as well as diffusion of the metal in the base, the uppermost plating layer can be formed thinner than in a conventional structure, which reduces the cost of materials. Furthermore, forming a thinner plating layer reduces the time required for plating, which not only increases manufacturing efficiency, but also contributes to cost reduction by reducing manufacturing lead time.

The lead frame for a semiconductor device according to the present invention does not depend on the facilities and equipment to form an intermediate plating layer as in conventional technology, thus achieving a major reduction in manufacturing cost. The present invention thus provides a lead frame for a semiconductor device that is inexpensive, highly efficient to manufacture, and that has excellent electrical connection properties.

From the perspectives of functionality, structure, etc., the lead frame according to the present invention therefore has completely different characteristics than a conventional lead frame in which general plating, surface treatment, etc. have been applied to conductive base material.

BRIEF DESCRIPTION OF DRAWINGS

FIGS. 7A and 7B are partial cross-section diagrams showing structures that illustrate problems with the conventional lead frames for semiconductor devices.

DESCRIPTION OF EMBODIMENTS

The following describes Embodiments of the present invention with reference to the attached figures. The present invention is not limited to these embodiments and may be embodied in any way that does not depart from the scope of the invention.

<Embodiment 1>

Figure 1:
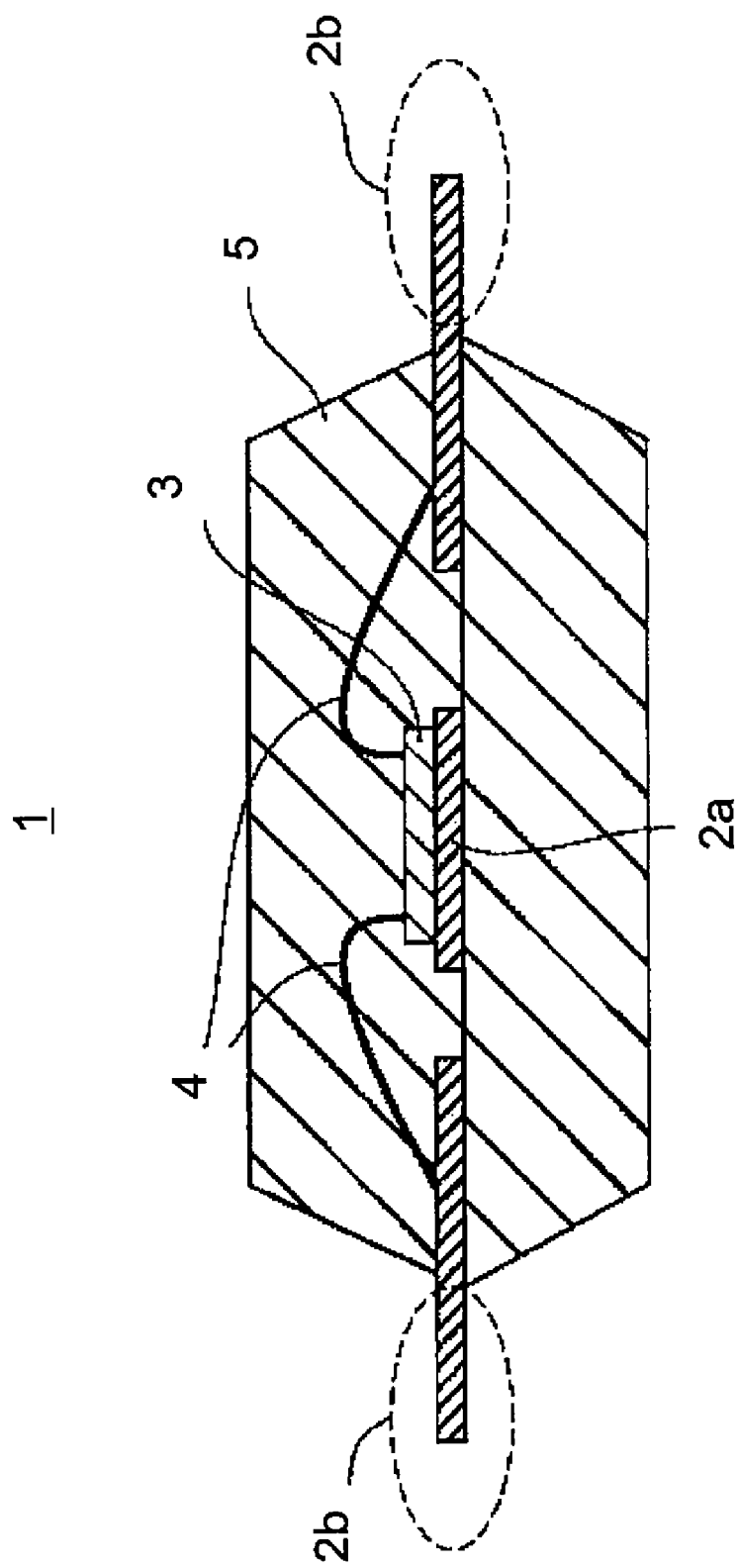
FIG. 1 is a cross-section diagram showing a structure of a semiconductor device according to Embodiment 1.

FIG. 1 is a cross-section diagram showing a structure of a semiconductor device 1 according to Embodiment 1 of the present invention.

The semiconductor device 1 includes a lead frame (2a, 2b) to which predetermined patterning has been applied. A semiconductor element 3 is mounted on an inner lead 2a, and the semiconductor element 3 is connected to outer leads 2b by bonding wires 4. The inner lead 2a, semiconductor element 3, bonding wires 4, and portions of the outer leads 2b are packaged by sealing resin 5.

Figure 2A:
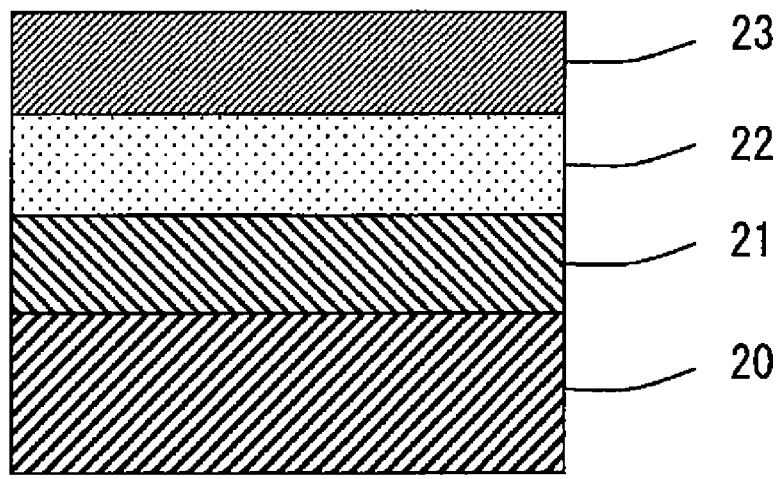
FIGS. 2A and 2B are partial cross-section diagrams showing a structure of a lead frame for a semiconductor device according to Embodiment 1.

FIG. 2A is a partial cross-section diagram of the lead frame (2a, 2b) in the semiconductor device 1. The lead frame (2a, 2b) has a laminated structure that includes a conductive base 20, a lower plating layer 21 formed thereon, an uppermost plating layer 23, and an organic film 22 between the lower plating layer 21 and the uppermost plating layer 23. The organic film 22 has metal-binding properties.

The conductive base 20 is the base of the lead frame (2a, 2b) and is formed from a metal body of copper, a copper alloy, iron, or an iron alloy.

The lower plating layer 21 is formed from nickel or a nickel alloy, copper or a copper alloy, or from a precious metal such as palladium or a palladium alloy.

The uppermost plating layer 23 is formed from a precious metal such as silver or a silver alloy, palladium or a palladium alloy, or gold or a gold alloy.

Note that the lower plating layer 21 is not an essential component. Instead, the organic film 22 may be formed directly on the conductive base 20, with the uppermost plating layer 23 layered on the organic film 22.

The lower plating layer 21 and uppermost plating layer 23 may be formed by any known method such as electrolytic plating, non-electrolytic plating, deposition plating, a sputtering method, etc.

The organic film 22 is the main characteristic component of the present invention and is formed as a monomolecular film by self-assembly based on molecular interaction between predetermined functional organic molecules 11 (hereinafter, simply "organic molecules 11"). By providing the organic film 22 between the lower plating layer 21 and the uppermost plating layer 23, the metals layers 21 and 23 firmly bond and maintain their mutual adhesion.

Figure 2B:
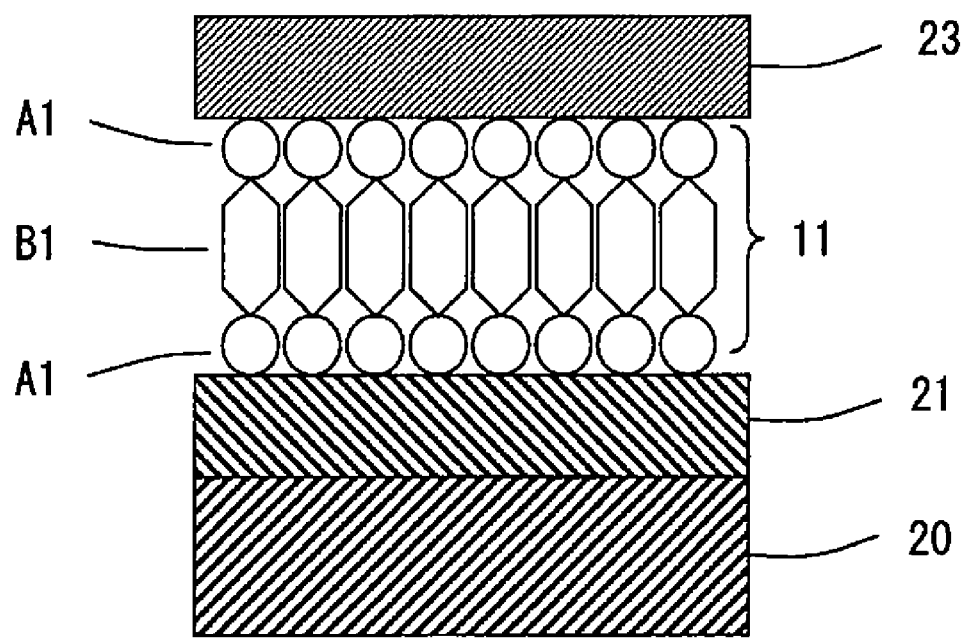

FIG. 2B shows the same structure as FIG. 2A, schematically showing the chemical structure and orientation characteristics of each of the organic molecules 11 in the organic film 22.

As shown in FIG. 2B, each of the organic molecules 11 is chemically structured to have a molecular structure with two or more polar groups. A specific example of one of the organic molecules 11 is a main chain B1 and a polar group at both ends (functional groups A1, A1).

The functional groups A1, A1 at both ends are required to have affinity with metal and to have metal-binding properties (including coordinate bonds). Any compound, chemical structure, or derivative having functional groups A1, A1 with these properties may be used, whether the functional groups A1, A1 are the same or different. In other words, the functional groups at either end of a molecule may differ from each other.

It is preferable to use, for example, one selected from the group consisting of thiol, a thiol compound, a sulfide compound (disulfide compound), nitrogen-containing heterocycle compound (azole compound, azine compound, etc.), or a compound, chemical structure, or derivative including at least one selected from the above group, as the above exhibit hydrogen bonding and coordinate bonding with respect to metal atoms.

When including a thiol group or disulfide group, the functional groups A1, A1 coordinate with metals such as gold, silver, nickel, copper, aluminum, palladium, platinum, etc. Covalent bonding occurs, forming a strongly bonded structure.

On the other hand, in the main chain B1, a compound, chemical structure, or derivative including at least one selected from the group consisting of an aryl skeleton, an acene skeleton, a pyrene skeleton, a phenanthrene skeleton, a fluorene skeleton, and a nitrogen-containing heterocycle containing at least two nitrogen atoms is used. It is preferable to form the main chain B1 from the aromatic series, for example, as the molecules associate with each other, particularly forming a dense sequence at the supramolecular level.

It is preferable that the nitrogen-containing heterocycle be a compound, chemical structure, or derivative including at least one selected from the group consisting of imidazole, triazole, tetrazole, oxadiazole, thiadiazole, pyrimidine, pyridazine, pyrazine, and triazine.

Furthermore, as the main chain B1, it is preferable to use typical methylene series organic molecules, a type thereof (a compound, chemical structure, or derivative that includes at least one selected from the group consisting of a methylene chain, a fluoromethylene chain, a siloxane chain, and a glycol chain), etc., for which formation of a dense carbon chain via a hydrocarbon chain can be expected.

By using a fluoromethylene chain as the main chain B1, the organic film 22 is endowed with a strong hydrophobic property, since the hydrophobic property of the fluoromethylene chain is stronger than the hydrophobic property of a methylene chain. This reduces penetration of external moisture between the lower plating layer 21 and the organic film 22, as well as between the organic film 22 and the uppermost plating layer 23. As a result, excellent bonding is maintained between the lower plating layer 21 and the organic film 22, and between the organic film 22 and the uppermost plating layer 23. Peeling of the film due to thermal hysteresis is also controlled, thus guaranteeing the adhesive properties of the plating.

Using a siloxane chain as the main chain B1 provides excellent heat resistance and weatherability. Thus, the organic film 22 does not deform or become damaged even in a relatively high temperature environment, such as when packaging the semiconductor element, thus guaranteeing stable adhesive properties between the lower plating layer 21 and the uppermost plating layer 23.

When using a glycol chain as the main chain B1, the organic film 22 is formed efficiently due to the interaction of the hydrophilic property of the organic molecules 11, and when preparing the film material, the organic molecules 11 easily dissolve in a polar solvent such as water. Accordingly, either a glycol chain, or a glycol chain and at least one selected from the group consisting of a methylene chain, a fluoromethylene chain, and a siloxane chain may be used as the main chain B1.

In an organic film 22 that adopts organic molecules 11 having the above characteristics, the functional groups A1, A1 at either end of each of the organic molecules 11 form strong bonds with both the lower plating layer 21 and the uppermost plating layer 23. The lower plating layer 21 and the uppermost plating layer 23 in the lead frame 2a, 2b can thus maintain a laminated structure with excellent adhesive properties. Therefore, even if either of the layers 21 or 23 deteriorates to some degree, the layers 21 and 23 are prevented from peeling apart.

As a result of these advantageous effects, excellent adhesive properties between plating layers can be expected without forming an intermediate plating layer as in a conventional structure.

The main chain B1 in each of the organic molecules 11 has the property of intermolecular interaction, and due to this property, the organic molecules 11 form a dense sequence. The organic film 22 thus forms in a stable condition. Formation of a dense organic film 22 effectively reduces the occurrence of problems such as external diffusion towards the uppermost plating layer 23 of the metal included in the lower plating layer 21 and formation of an oxide film due to the diffused metal coming into contact with air.

Furthermore, the dense organic film 22 effectively cuts off penetration of oxygen, corrosive gases, humidity, moisture, etc. Therefore, even if holes form in, for example, the uppermost plating layer 23 and the above components enter through the holes, the occurrence of problems such as oxidation or corrosion of the lower plating layer 21 or the conductive material 20, formation of an oxide film on the plating boundary surface, etc., is reduced. As a result, a stable plating layer and stable conductivity are maintained in the conductive material 20 and the lower plating layer 21. Furthermore, the above structure solves problems related to deterioration in wire bonding properties solderability due to oxidation of the lower plating layer 21, and to an increase in contact resistance.

<Embodiment 2>

The following is an example of a method of manufacturing the lead frame in the present invention.

Figure 3:
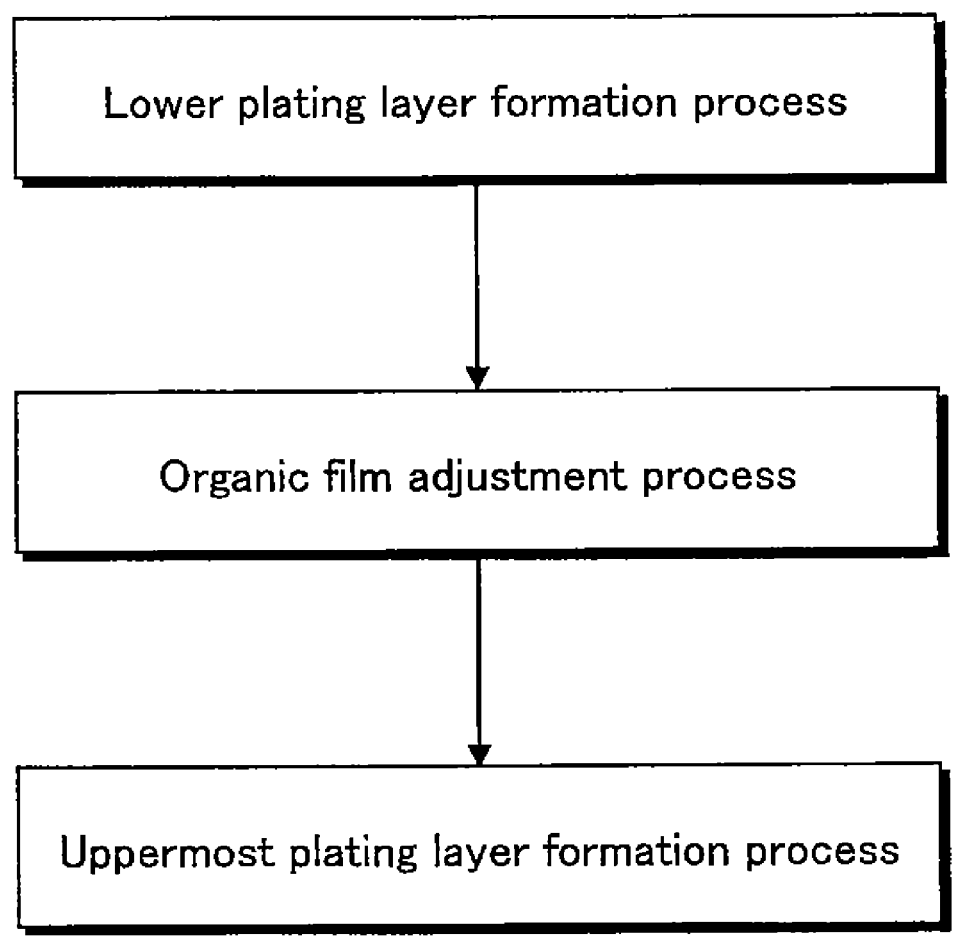
FIG. 3 shows a process flow of a method of manufacturing a lead frame for a semiconductor device according to Embodiment 2.

FIG. 3 shows a process flow of a method of manufacturing a lead frame for a semiconductor device according to the present invention. As shown in FIG. 3, the steps of the method of manufacturing are first to form a lower plating layer on a conductive base, then to form an organic film, and subsequently to form an uppermost plating layer. The following describes each step with reference to FIGS. 4 and 5A-C.

[Lower Plating Layer Formation Process]

First, a conductive base, which has been formed from copper or a copper alloy by a molding technique such as press molding or etching, is prepared. A plating layer of nickel or a nickel compound is formed on the conductive base as the lower plating layer. The thickness of the lower plating layer is preferably from 0.2 μm to 5.0 μm. It is preferable that this lower plating layer be formed by, for example, electrolytic plating.

Note that the material for the lower plating layer may also be copper or a copper alloy, or palladium or a palladium alloy. The plating method may also be non-electrolytic plating, deposition plating, a sputtering method, etc.

[Organic Film Formation Process]

Figure 4:
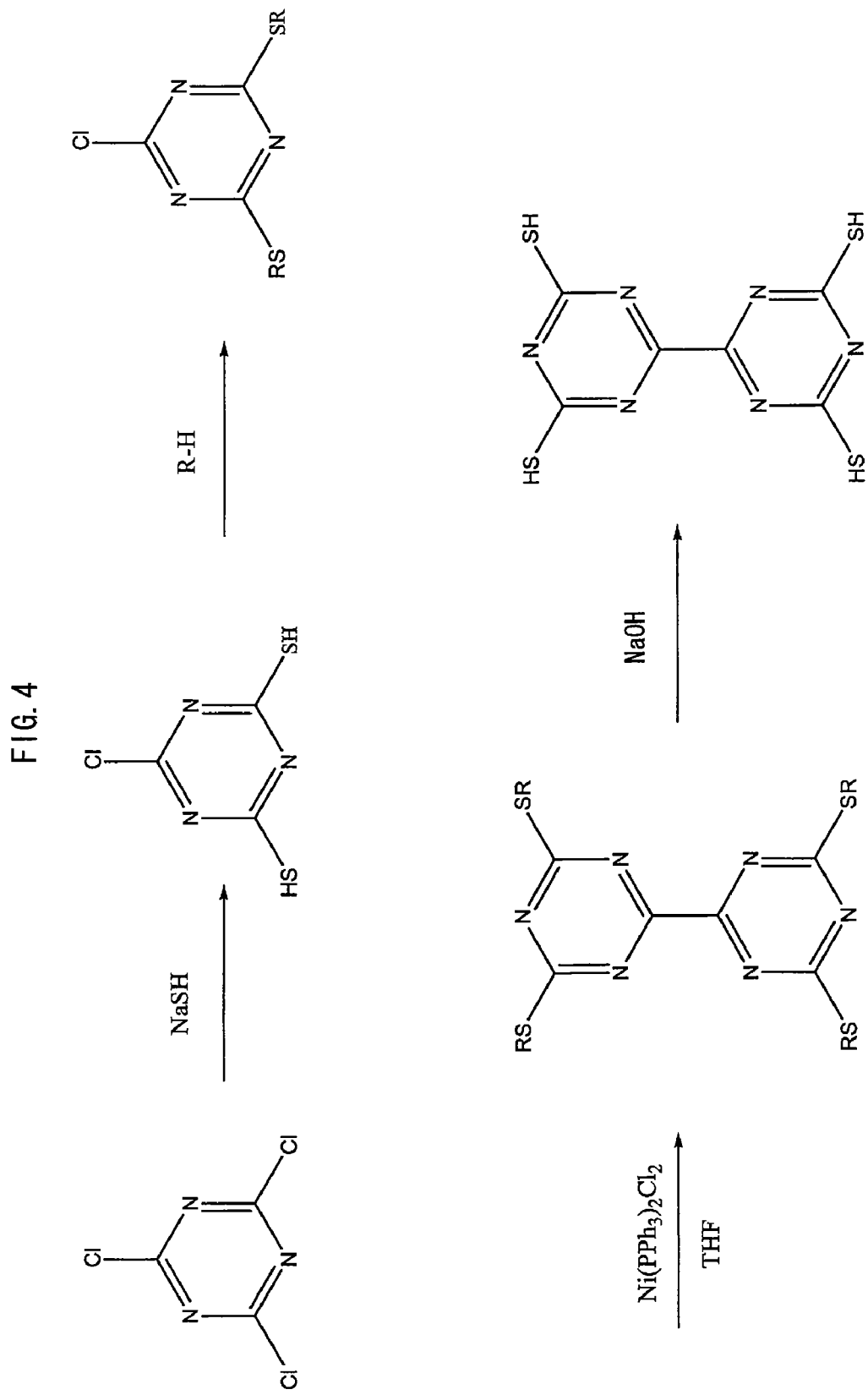
FIG. 4 shows an example of a synthesis reaction process of a functional organic molecule according to Embodiment 2.
Figure 5A:
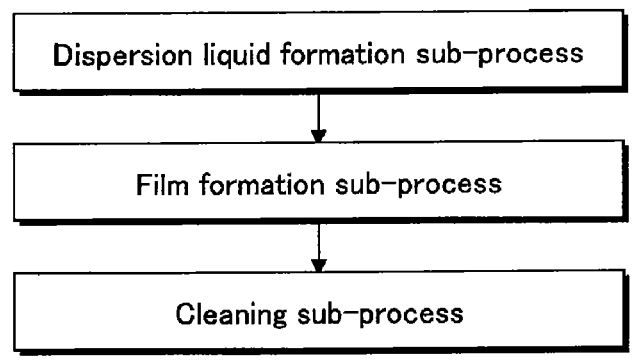
FIGS. 5A, 5B, and 5C show a formation process of a functional organic film according to Embodiment 2.

In the organic film formation process, functional organic molecules first undergo a predetermined synthesis process (FIG. 4). Subsequently, a dispersion liquid adjustment sub-process, film formation sub-process, and cleaning sub-process are performed in this order (FIG. 5A).

(Synthesis of Functional Organic Molecules)

FIG. 4 shows an example of a synthesis process when each of the organic molecules 11 is formed with a molecular structure in which the functional groups A1, A1 at either end are a thiol compound, and the main chain B1 is a type of nitrogen-containing heterocycle compound, specifically a triazine ring skeleton.

As an example of a method of synthesizing the organic molecules 11, cyanuric acid chloride is first treated with thiol hydrosulfide. Only two functional groups of chloride are thiolated. The thiol is then protected (see Japanese Patent Application Publication No. 2007-176848). Note that the protective group indicated by "R" in FIG. 4 may be 2-(2-ethylhexyl-oxycarbonyl)ethyl.

Next, based on what is recited in the already available ORGANIC LETTERS, 2008, VOL. 10, NO. 5, 709-712, a cyanuric acid chloride derivative in which thiol is protected is caused to undergo a homocoupling reaction in a tetrahydrofuran (THF) solvent using an organic nickel catalyst. By reacting the result with sodium hydroxide, the organic molecules 11 for forming the organic layer 22 are obtained.

Note that this synthesis process for the organic molecules 11 is only an example. The organic molecules 11 may of course be formed by any method appropriate for the variations on the structure of the organic molecules 11 as disclosed in Embodiment 1.

(Dispersion Liquid Adjustment Sub-Process)

Figure 5B:
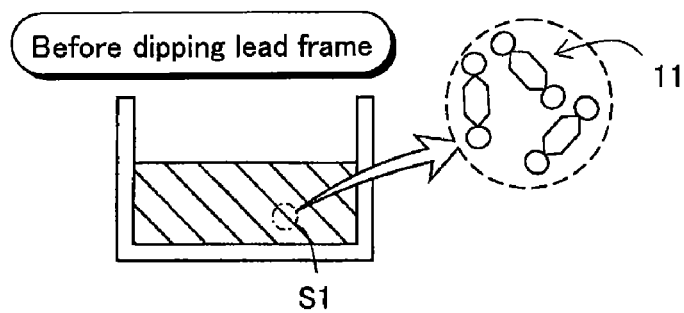

Next, the organic molecules 11 obtained above are dispersed in a predetermined solvent to create a dispersion liquid, as in FIG. 5B. An organic solvent, water, or a mixture thereof is used as the predetermined solvent. When using water as the solvent, it is preferable to add an anionic, cationic, or nonionic surfactant as necessary to achieve dispersion of the organic molecules 11. To further stabilize the organic molecules 11, a boric acid based or phosphoric acid based pH buffer, antioxidant, etc. may be added.

(Film Formation Sub-Process)

Figure 5C:
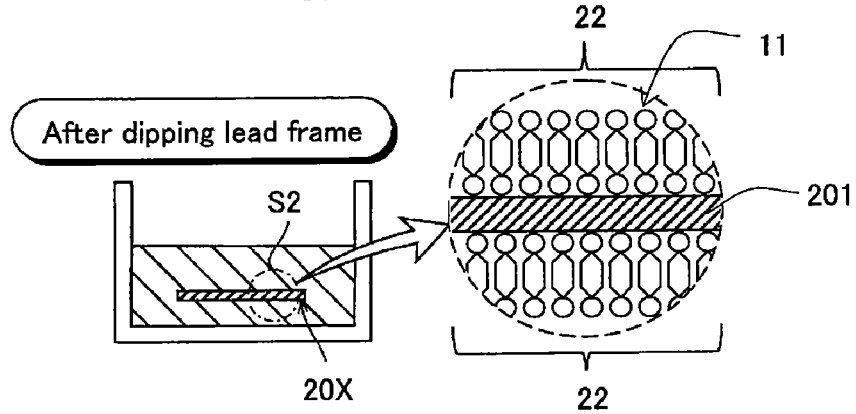
Figure 6A:
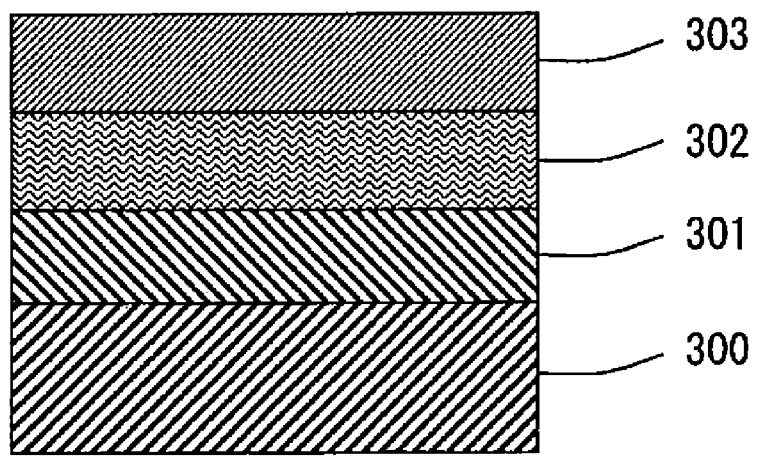
FIGS. 6A and 6B are partial cross-section diagrams showing structures of conventional lead frames for semiconductor devices.
Figure 6B:
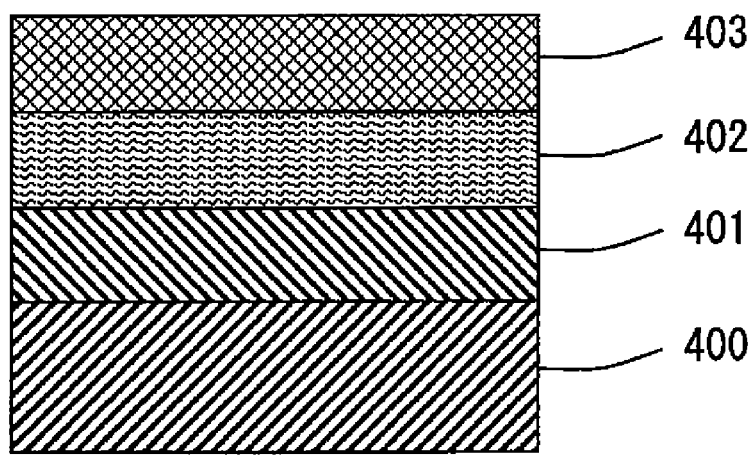

Next, as shown in FIG. 5C, a frame 201 formed of metal and on which a lower plating layer has been provided is dipped in the dispersion liquid created as above.

In the dispersion liquid, the organic molecules 11 have a relatively high Gibbs free energy and interact so as to repel each other and move randomly (i.e. Brownian motion), as shown in the expanded view of S1 in FIG. 5B.

By dipping the frame 201 into this dispersion liquid, the organic molecules 11 seek a more stable state, and functional groups A1 at one end of the organic molecules 11 bind with the metal on the surface of the frame 201, since the functional groups A1 have metal-binding properties. As shown in the expanded view of S2 in FIG. 5C, the organic molecules 11 form a stable film, with the metal-binding functional groups A1 at the other end aligned along the top surface of the film.

By undergoing the above process, the organic molecules 11 self-assemble to form a monomolecular film. Pulling the frame 201 out of the dispersion liquid yields a material 20X having an organic film 22 on the lower plating layer.

While an example of dipping the frame 201 in the dispersion liquid to form the organic film 22 has been shown, formation of the organic film 22 is not limited in this way. For example, the same organic film 22 may be formed by other methods, such as spraying the dispersion liquid on the frame 201.

(Cleaning Sub-Process)

Next, the material 20X is cleaned with a cleaning medium that is an organic solvent, water, or a mixture thereof, thus removing the dispersion liquid which includes excess organic molecules 11. With this cleaning, functional organic molecules 11 whose functional groups A1, A1 have not bonded with metal at one end are easily removed. This concludes the organic film formation process.

[Uppermost Plating Layer Formation Process]

On the organic film 22 that has been formed, an uppermost plating layer is formed to a thickness of 0.002 μm-5.0 μm from at least one selected from the group consisting of silver or a silver alloy, palladium or a palladium alloy, and gold or a gold alloy. Electrolytic plating is the preferable method for forming the uppermost plating layer, but the layer may also be formed with non-electrolytic plating, deposition plating, a sputtering method, etc.

Upon forming the uppermost plating layer via this formation process, the lead frame of the present invention is acquired.

Forming the organic film 22 on the lower plating layer according to the method of manufacturing of Embodiment 2 prevents corrosion and oxidation of the lower plating layer and also prevents diffusion of the metal in the base material. This allows the uppermost plating layer 23 to be formed relatively thin, which reduces the cost of materials. Furthermore, forming a thinner plating layer reduces the time required for plating. Reducing the manufacturing lead time in this way also contributes to cost reduction.

The method of manufacturing according to the present invention reduces the enormous manufacturing cost that is necessary for facilities and equipment to form an intermediate plating layer, thus achieving a lead frame for a semiconductor device that is low cost, highly efficient to manufacture, and that has excellent electrical connection properties.

<Other Considerations>

In the above embodiments, the organic film is a monomolecular film whose functional organic molecules self assemble, but the organic film is not limited to a monomolecular film. For example, as long as the bonding strength with the uppermost plating layer is sufficient, the organic film may be formed from a plurality of layers.

Note that in such an organic film having a plurality of layers, a first layer and a second layer of functional organic molecules are required to have bonding properties between molecules adjacent in a direction of thickness. Accordingly, a compound or structure whose functional groups at either end have metal-binding properties and whose first functional groups bond with each other may be used.

[Industrial Applicability]

The present invention is useful in devices such as a semiconductor device packaged with sealing resin, e.g. an IC, LSI, VLSI, etc., and an LED illumination device having an LED element mounted therein. The present invention is also useful in methods of manufacturing such devices.

[Reference Signs List]

A1 terminal functional group
B1 main chain
1 semiconductor device
2a, 2b lead frame
3 semiconductor element
4 bonding wire
5 sealing resin
11 functional organic molecules (organic molecules)
20, 300, 400, 500, 600 conductive material
21, 301, 401, 501 lower plating layer
22 organic film
23, 303, 403, 503, 603 uppermost plating layer
201 frame
302, 402, 602 intermediate plating layer
501a, 603a oxide film

The invention claimed is:

1. A lead frame for a semiconductor device, the lead frame comprising:
an electrically conductive base;
a lower plating layer formed on the electrically conductive base;
an organic film formed on the lower plating layer; and
an uppermost plating layer formed on the organic film, wherein
the organic film has metal-binding properties with respect to the lower plating layer and the uppermost plating layer.

2. The lead frame for a semiconductor device of claim 1, wherein
the lower plating layer is formed of a precious metal.

3. The lead frame for a semiconductor device of claim 1, wherein
the lower plating layer and the uppermost plating layer are formed of a precious metal.

4. The lead frame for a semiconductor device of claim 1, wherein
the organic film includes a plurality of organic molecules each having a molecular configuration with two or more polar groups, and one of the polar groups in each organic molecule is bound to metal forming the lower plating layer, so that the organic film coats the lower plating layer.

5. The lead frame for a semiconductor device of claim 1, wherein
the organic film is formed of organic molecules that self assemble, and
the organic molecules have, at both ends, a functional group with metal-binding properties.

6. The lead frame for a semiconductor device of claim 5, wherein
a main chain of each of the organic molecules is a compound, chemical structure, or derivative including at least one selected from the group consisting of an aryl skeleton, an acene skeleton, a pyrene skeleton, a phenanthrene skeleton, a fluorene skeleton, and a nitrogen-containing heterocycle containing at least two nitrogen atoms.

7. The lead frame for a semiconductor device of claim 6, wherein
the nitrogen-containing heterocycle is a compound, chemical structure, or derivative including at least one selected from the group consisting of imidazole, triazole, tetrazole, oxadiazole, thiadiazole, pyrimidine, pyridazine, pyrazine, and triazine.

8. The lead frame for a semiconductor device of claim 5, wherein
the functional group with metal-binding properties is a compound, chemical structure, or derivative including at least one selected from the group consisting of a thiol compound, a sulfide compound, and a nitrogen-containing heterocycle compound.

9. A method of manufacturing a lead frame for a semiconductor device comprising the steps of
(a) forming a lower plating layer on a conductive base;
(b) forming an organic film on a surface of the lower plating layer; and
(c) forming an uppermost plating layer on a surface of the organic film, wherein
the organic film formed in step (c) has metal-binding properties with respect to the lower plating layer and the uppermost plating layer.

10. The method of manufacturing the lead frame for a semiconductor device of claim 9, wherein
step (b) includes creating a dispersion liquid by dispersing an organic compound in a solvent and dipping the conductive base on which the lower plating layer is formed into the dispersion liquid.

\* \* \* \* \*